US007009908B2

(12) United States Patent
Fischer

(10) Patent No.: US 7,009,908 B2
(45) Date of Patent: *Mar. 7, 2006

(54) DECODING DEVICE

(75) Inventor: Helmut Fischer, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 968 days.

This patent is subject to a terminal disclaimer.

(21) Appl. No.: 09/907,758

(22) Filed: Jul. 18, 2001

(65) Prior Publication Data

US 2002/0015455 A1 Feb. 7, 2002

(30) Foreign Application Priority Data

Jul. 18, 2000 (DE) ................................ 100 34 925

(51) Int. Cl.
*G11C 8/00* (2006.01)

(52) U.S. Cl. ........................... 365/230.06; 365/189.09; 365/189.11; 326/105

(58) Field of Classification Search ................ 326/105, 326/106, 108, 30; 327/108; 365/230.06, 365/189.09, 189.11, 3
See application file for complete search history.

(56) References Cited

U.S. PATENT DOCUMENTS

| | | | | |
|---|---|---|---|---|
| 5,021,688 | A * | 6/1991 | Leforestier et al. | 326/105 |
| 5,557,580 | A | 9/1996 | Numaga et al. | |
| 5,726,938 | A * | 3/1998 | Okamoto | 365/189.11 |
| 6,456,119 | B1 * | 9/2002 | Fischer | 326/105 |

* cited by examiner

*Primary Examiner*—Vibol Tan
(74) *Attorney, Agent, or Firm*—Laurence A. Greenberg; Werner H. Stemer; Ralph E. Locher

(57) ABSTRACT

A decoding device includes a final decoder having at least one field-controlled semiconductor switching device. A transmission signal has a characteristic curve such that, in the event of an inactivation of the field-controlled semiconductor switching device, it is substantially completely blocked for transmission of a transmission signal by applying the transmission signal to the semiconductor switching device. Thus a particularly reliable operation of the decoding device is achieved.

32 Claims, 3 Drawing Sheets

DECODING DEVICE

BACKGROUND OF THE INVENTION

Field of the Invention

The invention relates to a decoding device. In the fields of microelectronics, information technology and the like, it is often necessary to code and/or decode a number of addresses of electronic components by using hardware, in order to address memory elements, sensor elements (e.g. of image sensors, actuator elements or the like). This includes addressing their contents in order to read them, change their status, and so on.

Particularly in memory modules such as DRAMs (Dynamic Random Access Memories), it is common to select individual word lines from predecoded addresses in a word line decoder. To accomplish this, a final decoder is provided in conventional decoders for switchably transmitting a transmission signal, for instance a word line signal. The final decoder includes a first switching unit, with at least one field-controlled semiconductor switching device as the switch element. The conventional decoder also includes a transmission signal driver. This transmission signal driver is provided in the region of a transmission signal line for the purpose of generating a transmission signal and providing the transmission signal on the transmission signal line of the final decoder.

A drive line on which a driver signal is carried is usually utilized to select an area or range of so-called word lines and thus to put these in an activatable state. A range of components that are to be addressed corresponds to the range of word lines. In DRAMs this is known as a cell field of transistors, which are essentially put in an activatable or inactivatable state by a corresponding driver signal. The concrete selection of a word line and thus of an individual electronic component, for instance a specific transistor, is accomplished by way of preselected and correspondingly activated or inactivated word line drive lines. Only when the drive line belonging to a respective field-controlled semiconductor switching device and the appertaining word line drive line simultaneously carry a signal portion designating activation, for instance with the aid of a correspondingly selected electrical potential, is the corresponding switching unit or field-controlled semiconductor switching device actually put into an activated (i.e. conductive) state, as a consequence of which the transmission signal is then present on the word line in order to address a particular electronic component.

Due to the selection, which is realized by the interconnection or configuration of the decoder, of a specific electronic component from a plurality of components (e.g. n components), all field-controlled semiconductor switching devices of a group of activatable field-controlled semiconductor switching devices which correspond to the n components receive the driver signal designating an activation. But because only a single electronic component is actually intended to be selected, all the other field-controlled semiconductor switching devices, which do not correspond to selected electronic components of the group, receive a signal designating inactivation on their respective word line drive lines, i.e. on the transmission signal line.

As a result, potential differences exist at the respective field-controlled semiconductor switching devices in dependence upon the selection of the signals or potentials designating activation or inactivation, which potential differences allow a flow of various electric currents (zero current), or at least do not preclude such a current flow, though they do not enable a through-switching or activation of the respective field-controlled semiconductor switching device in the strict sense.

Consequently, in conventional decoders with corresponding final decoders including at least one field-controlled semiconductor switching device, signals or leakage currents are transmitted even in the inactive state of the field-controlled semiconductor switching device. Besides the corresponding energy losses, these leakage currents or zero currents also represent possible sources of error, because these types of signals can be superimposed throughout the network in an unpredictable fashion, ultimately causing disturbances of one form or another.

Although these additional leakage currents typically run at a low level and have therefore been treated as a problem of minor importance and have been neglected hitherto, it is of crucial importance to take these additional leakage currents into consideration, particularly in view of the long-term behavior of the corresponding decoders and furthermore in view of fundamentally novel transistor technologies whose lower threshold voltage behavior defies estimation by contemporary means.

SUMMARY OF THE INVENTION

It is accordingly an object of the invention to provide a decoding device which overcomes the above-mentioned disadvantages of the heretofore-known decoding devices of this general type and which can be operated particularly carefully and at the same time reliably.

With the foregoing and other objects in view there is provided, in accordance with the invention, a decoding device, including:

a final decoder for switchably transmitting a transmission signal, the final decoder including a switching unit having a field-controlled semiconductor switching device;

a transmission signal line connected to the final decoder;

a transmission signal driver operatively connected to the transmission signal line for generating a transmission signal with a given characteristic curve and for providing the transmission signal to the final decoder; and the transmission signal driver generating the transmission signal such that the characteristic curve is such that the field-controlled semiconductor switching device is one of substantially completely blockable and substantially completely blocked for a transmission of the transmission signal when the transmission signal is applied to the field-controlled semiconductor switching device and the field-controlled semiconductor switching device is inactivated.

The solution according to the invention provides that the transmission signal driver can generate the transmission signal with such a characteristic or signal course—particularly with such a time characteristic of the electrical potential—that providing the respective semiconductor switching device with the transmission signal, namely at an input terminal thereof, renders it substantially completely blockable or completely blocked for a transmission of the transmission signal in the event of an inactivation of the semiconductor switching device.

A fundamental aspect of the inventive solution thus includes impressing a particular characteristic curve upon the transmission signal. This specific signal characteristic curve is suited both to preventing a through-switching of the respective field-controlled semiconductor switching device and to substantially hindering any other transmission by the switching device in the event of an inactivation of the respective semiconductor switching device. In contrast to conventional decoders, the occurrence of the above described leakage currents is hereby prevented. What characteristic curve must be generated for the transmission signal given the inactivation of the respective field-controlled semiconductor switching device is governed by the specific type of semiconductor switching device, whereby the respective driver signal and its time characteristic are also taken into account with respect to activating or inactivating states according to the invention.

The transmission signals utilized in the prior art carry a high signal for activating a field-controlled semiconductor switching device, and a corresponding low signal at ground potential for inactivating the field-controlled semiconductor switching device. But in the event that a driver signal is below the neutral ground potential in the active state, in the prior art, particularly with p-MOS field-effect transistors of the enhancement type, specific leakage currents occur, even in the inactive state of the field-controlled semiconductor switching device, because these are at least partly conductive for particular negative potential differences.

The tuning of the characteristic curve of the transmission signal given inactivation of the field-controlled semiconductor switching device in consideration of the configuration of this field-controlled semiconductor switching device, and the tuning of the driver signal's characteristic curve according to the invention, prevent these leakage currents, whereby, unlike in the prior art, a particularly careful and nevertheless reliable operation of the decoding device according to the invention is guaranteed.

The field-controlled semiconductor switching device is expediently configured as a field-effect transistor, particularly a p-MOSFET (Metal Oxide Field Effect Transistor), an n-MOSFET or the like. In a particularly preferred embodiment of the decoding device according to the invention, the gate region of the respective field-effect transistor is configured as a control terminal, the source region is configured as an input terminal, and/or the drain region is configured as an output terminal of the field-controlled semiconductor switching device.

In another preferred embodiment of the decoding device according to the invention, the input terminal, the control terminal and/or the output terminal of the respective field-controlled semiconductor switching device are configured so as to be connectible to the transmission signal line, a driver signal line, and an output signal line, respectively, which are configured to supply the transmission signal to the input terminal, to supply a driver signal to the control terminal, and to deliver an output signal from the output terminal of the respective field-controlled semiconductor switching device, respectively.

The basic interconnecting of the field-controlled semiconductor switching device is realized by these measures. The three existing terminals—namely the input terminal, the output terminal, and the control terminal—are thus connected to corresponding lines. The transmission signal is supplied to the input terminal over the transmission signal line. The corresponding driver signal through the use of which the cell field of a DRAM is selected is supplied to the control terminal of the field-controlled semiconductor switching device over the driver signal line. The transmission behavior of the field-controlled semiconductor switching device with respect to the transmission signal at the input terminal, which is supplied by the transmission signal line, thus derives from the combination of the signals at the input and control terminals as the output signal on the output signal line.

To form the driver signal and thus to select the corresponding group of electronic components, e.g. the corresponding cell field of a DRAM, a driver is provided, with which the driver signal can be generated and transmitted on the driver signal line.

In accordance with a particularly preferred embodiment of the decoding device according to the invention, the field-controlled semiconductor switching device is configured specifically as an enhancement type p-MOS field-effect transistor, or an equivalent.

The advantage of this is that the driver signal which is generated by the driver carries a substantially relatively low electrical potential given activation of a respective field-controlled semiconductor switching device and a substantially relatively high electrical potential given inactivation of the respective field-controlled semiconductor switching device. Accordingly, in the embodiment which includes a p-MOSFET, the driver signal line is active given a low signal and inactive given a high signal.

Accordingly, it is provided that the transmission signal driver be configured such that, given inactivation of a respective field-controlled semiconductor switching device, a transmission signal can be generated and delivered to the input terminal thereof, whose target potential, which corresponds to the inactivation of the respective field-controlled semiconductor switching device, is substantially equal to or lower than the relatively low electrical potential of the driver signal, such that the respective field-controlled semiconductor switching device is inactivatable or inactivated by virtue of the electrical potential difference which develops between the respective input terminal and the respective control terminal.

This achieves that, with a p-MOSFET, given inactivation of a field-controlled semiconductor switching device, the presence of a low signal at the control terminal (i.e. the gate) corresponds with a target potential of the transmission signal, which is present at the input terminal due to the corresponding configuration of the transmission signal driver, such that the field-controlled semiconductor switching device, i.e. the p-MOSFET, is driven in the total blocking-state region of its characteristic curve. This is accomplished in that the maximum amount by which the target potential of the transmission signal deviates from or falls short of the low signal or the low electrical potential of the driver signal is so small that the gate-source voltage $U_{GS}$ of the respective field-controlled semiconductor switching device is not pushed so sharply into the negative potential range that leakage currents can already develop. Consequently, these measures accomplish a complete blocking of the inactivated word line.

In another embodiment of the decoding device according of the invention, it is provided that the field-controlled semiconductor switching device is configured as an n-MOS field-effect transistor, particularly of enhancement type, or the equivalent.

In this case, it is further provided that the driver signal which is generated by the driver carry a substantially relatively low electrical potential given inactivation and a substantially relatively high electrical potential given activation. In other words, the driver signal on the driver signal line is high-active and low-inactive.

Accordingly, it is provided that the transmission signal driver be configured such that, given inactivation of a respective field-controlled semiconductor switching device, a transmission signal can be generated and delivered to the input terminal thereof, whose target potential is substantially equal to or higher than the relatively high electrical potential of the driver signal such that the respective field-controlled semiconductor switching device is inactivatable or is inactivated by virtue of the electrical potential difference which develops between the respective input terminal and the respective control terminal.

What this achieves is that, with an n-MOSFET, given inactivation of a respective field-controlled semiconductor switching device, the target potential is set such that it corresponds to or exceeds the high-active signal portion of the driver signal, regardless of the region in which the high-active driver signal is located, such that, given the voltage developing between the input terminal and the control terminal, i.e. between the source and the gate, the n-MOSFET is still driven in the blocking-state region. This prevents through-switching given inactivation, and furthermore, contrary to the prior art, leakage currents do not arise.

In principle, the driver signals representing activation, i.e. a low-active or a high-active driver signal, can also be set to a neutral zero potential or ground potential. However, as a rule, the driver signals representing activation will differ from ground potential.

Thus, it can be provided that, given the utilization of a p-MOSFET as the field-controlled semiconductor switching device, the low-active driver signal carries a negative electrical potential, and the high-inactive driver signal carries a substantially positive potential. In a corresponding fashion, typically a high-active transmission signal with a positive electrical potential, and a low-inactive signal at zero or ground potential would then be provided as the transmission signals, i.e. the word line signals.

In the decoding device according to the invention, the transmission signal driver is configured such that, in this case, the high-active transmission signal substantially retains its positive potential, whereas the low-inactive transmission signal has a negative potential, at least in its target potential, which approximates or is less than the negative potential of the low-active driver signal, so that the difference between the potential of the driver signal at the control terminal or the gate of the p-MOSFET and the potential of the low-inactive transmission signal at the input terminal or the source of the p-MOSFET is either positive or is not so negative that the p-MOSFET is still driven in the total blocking-state region of its characteristic curve.

Other features which are considered as characteristic for the invention are set forth in the appended claims.

Although the invention is illustrated and described herein as embodied in a decoding device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
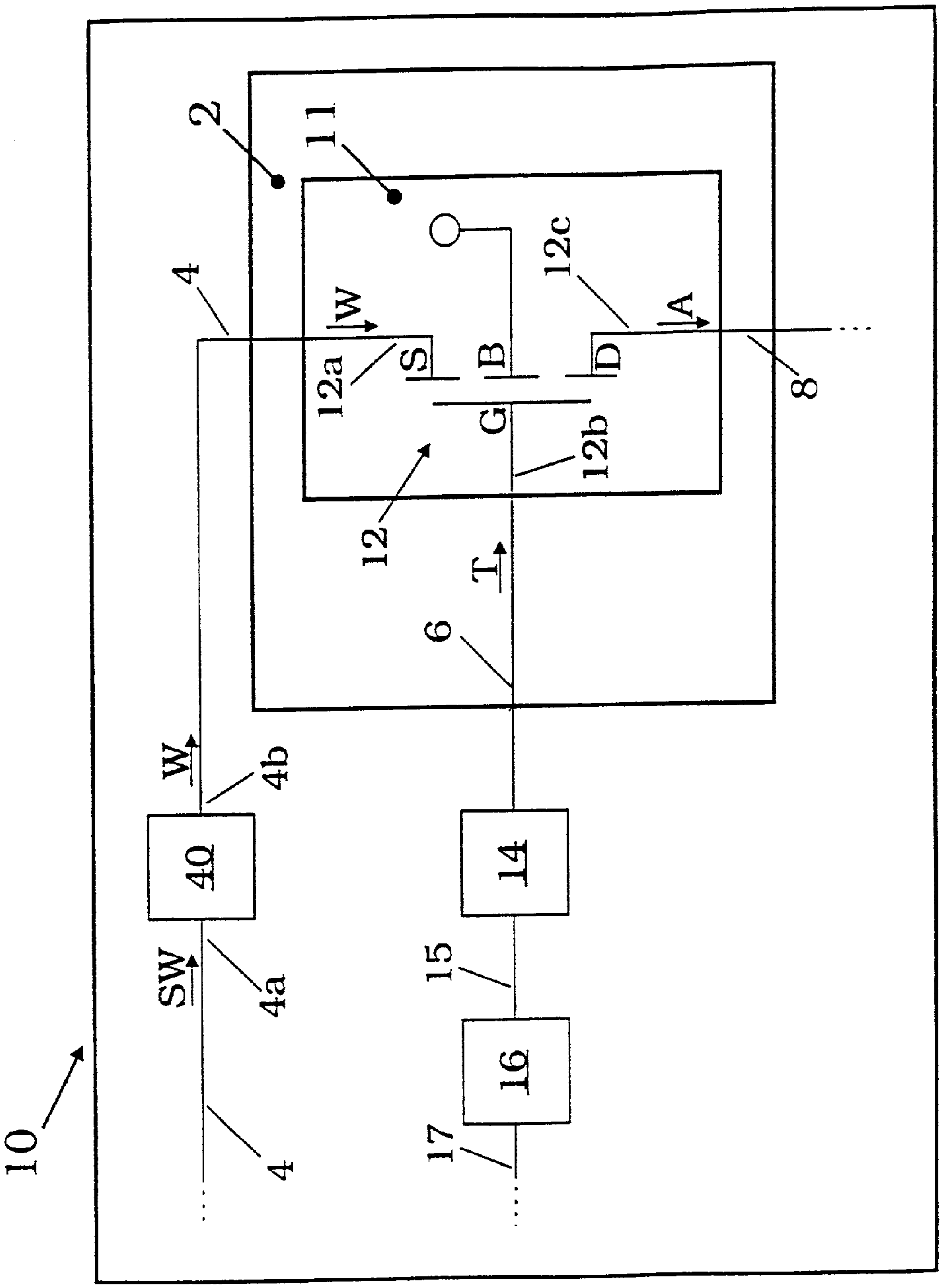
FIG. 1 is a schematic block diagram of a first exemplary embodiment of the decoding device according to the invention.

Referring now to the figures of the drawings in detail and first, particularly, to FIG. 1 thereof, there is shown a schematic block diagram of an exemplary embodiment of the decoding device 10 according to the invention. This decoding device 10 is in an exemplary manner formed of a final decoder 2, which is supplied with a transmission signal W over a transmission signal line 4 and a driver signal T over a driver signal line 6.

In this embodiment of the decoder 10 according to the invention, its final decoder 2 contains a first switching unit 11 for switchably transmitting the transmission signal W from the transmission signal line 4 to the output signal line 8 as output signal A. This switching unit 11 contains at least one p-MOS field-effect transistor 12, whose gate line G forms a control terminal 12*b* and is connected to the output signal line 4, and whose source line S forms an input terminal 12*a* and is connected to the driver signal line 6. With the aid of a high-low transition of the driver signal T from potential TH to potential TL on the driver signal line 6, the field-effect transistor 12 switches the transmission signal W on the transmission signal line 4, via the source line S and its drain line D, to the output line 8 and thus provides an output signal A on the output signal line 8, when the gate-source potential $U_{GS}$ between gate G and source S of the p-MOSFET 12 forces it to do so.

The driver signal T on the driver signal line 6 is generated and outputted by a driver 14. In this example, the driver signal carries a low-active signal with a relatively low potential TL<0 given activation, and a high-inactive signal with a relatively high potential TH>0 given inactivation.

The driver 14 is controlled by a precoder 16, which receives corresponding address signals over an external address bus 17 and provides a generated driver control signal to the driver 14 on a control bus 15.

In the region of the transmission signal line 4, the so-called transmission signal driver 40 is provided. This transmission signal driver 40 receives a control signal sequence SW, which may be externally supplied, at its input side 4*a*, generates a corresponding transmission signal W based on this control signal SW, and delivers this on the output side on the transmission signal line 4, so that the transmission signal W is supplied to the input terminal 12*a* and thus to the source region S of the p-MOSFET 12.

Figure 2:
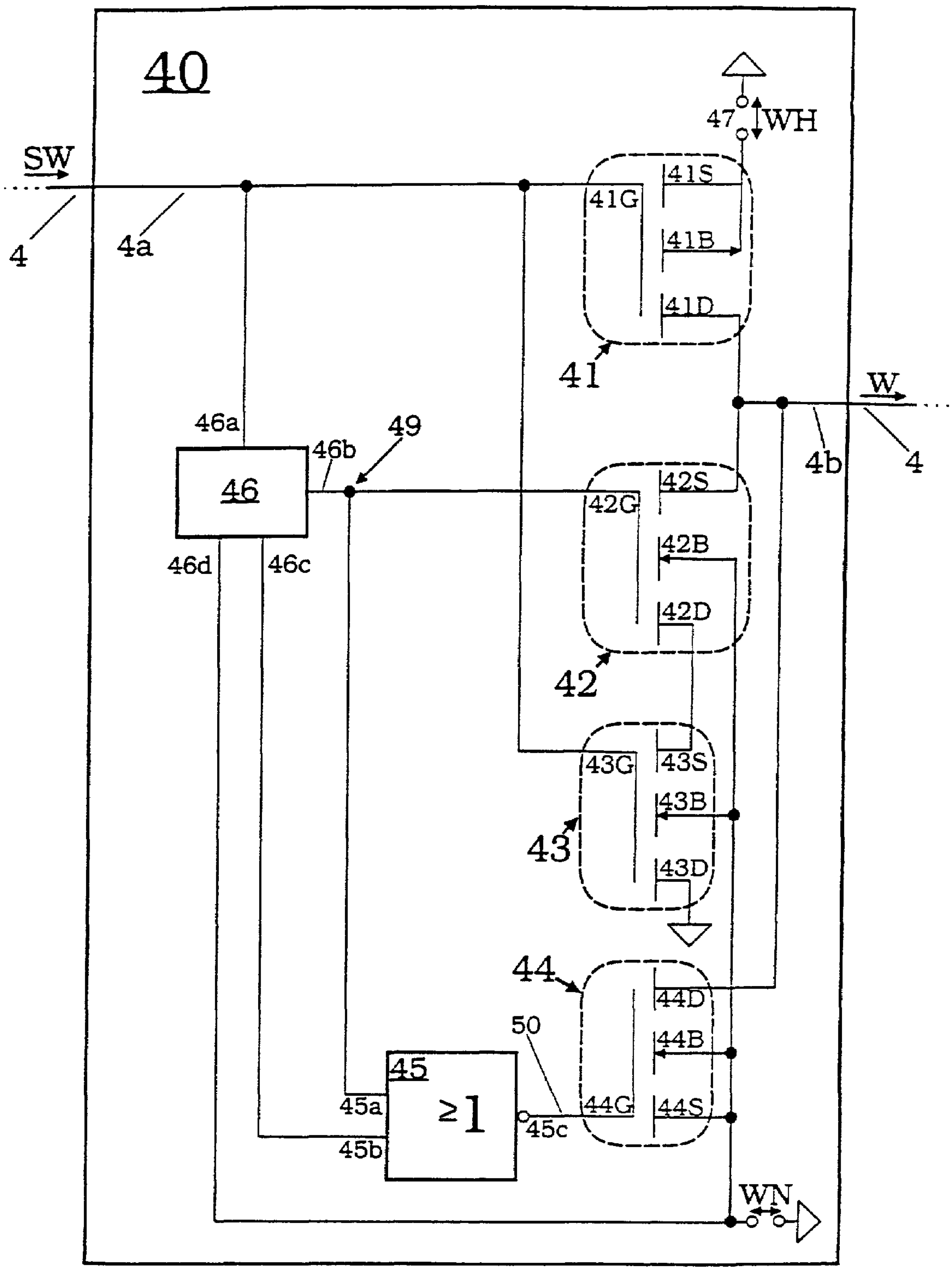
FIG. 2 is a schematic block diagram of a transmission signal driver of an exemplary embodiment of the decoding device according to the invention.

FIG. 2 shows a schematic block diagram with circuit details of the transmission signal driver 40 as it is used in the decoder 10 according to the invention.

The transmission signal driver 40 is provided in the transmission signal line 4 and includes an input terminal 4*a* and an output terminal 4*b*, by way of which a corresponding control signal SW and the outgoing transmission signal W are supplied and outputted, respectively.

The control signal SW which is supplied over the input line 4*a* substantially represents the inverse signal of the transmission signal W that is to be generated, at least with respect to its qualitative characteristic curve. This means that a low-active potential component SWL in the control signal SW corresponds to a high-active phase WH of the transmission signal W, and the same is true of inactive signal components and low-active transmission signals W, accordingly.

The transmission signal driver 40 includes a p-MOSFET 41 (gate region 41G, source region 41S, drain region 41D, substrate region 41B), a first n-MOSFET 42 (42G, 42S, 42D, 42B), and a second n-MOSFET 43 (43G, 43S, 43D, 43B).

These three field-effect transistors 41, 42, 43 are connected in this order, with the drain region of a preceding field-effect transistor being connected to the source region of the following field-effect transistor. This means that the drain region 41D is connected to the source region 42S, and the drain region 42D is connected to the source region 43S. The source region 41S is connected to the switching voltage (substantially WH) by way of a corresponding voltage source 47. The drain region 43D of the second n-MOSFET 43 is a ground potential. The control signal SW is supplied directly to the gate regions 41G and 43G of the p-MOSFET 41 and the n-MOSFET 43 by way of the input line 4*a*. The transmission signal W is supplied to the output region 4*b*, and thus to the transmission line 4, by way of the drain region 41D of the p-MOSFET 41.

In the prior art, essentially no additional switching elements are provided, so that, consequent to a low-active signal portion SWL of the control signal SW, the p-MOSFET 41 switches the positive switching voltage WH which is supplied by the voltage source 47 through to the output region 4*b* and thus to the transmission signal line 4. On the other hand, given a high-inactive signal level SWH of the control signal SW, the n-MOSFET 43 switches through and discharges the transmission signal line to the neutral ground potential by way of the first n-MOSFET 42, which is permanently conductive in the prior art.

Thus, in the prior art, the alternating switching of the p-MOSFET 41 and n-MOSFET 43 produces a high-active or low-inactive transmission signal W including WH and WL=0, respectively, on the transmission signal line 4, depending on whether a low-active or a high-inactive signal level SWL or SWH of the control signal SW is present.

In the embodiment, which is represented in FIG. 2, of the transmission signal driver 40 for the decoder 10 according to the invention, a so-called level converter 46 is provided which has an input terminal 46*a* and output terminals 46*b*–46*d* and which receives the control signal SW directly with its input region 46*a*.

In addition, a third n-MOSFET 44 (44G, 44S, 44D, 44B) is realized, whose drain region 44D is connected to the output region 4*b* of the transmission signal driver 40 and thus to the drain region 41D and the source region 42S of the p-MOSFET 41 and the first n-MOSFET 42, respectively.

The gate regions 42G and 44G of the first and third n-MOSFETs 42 and 44 are controlled by the level converter 46 via a corresponding interconnection, specifically in such a way that the switching of the p-MOSFET 41 and the first n-MOSFET 42 occurs in a staggered fashion. This means that, unlike in the prior art, the provided second n-MOSFET 42 is not continuously conductive or continuously through-switched, but rather only for purposes of temporarily charging the gate 42G with a corresponding signal pulse, namely a high-active signal MAH of a ground potential control impulse, by way of the interconnection to the node 49 in connection with the output 46*b* of the level converter 46, in order to force a lowering of the potential on the transmission signal line 4 from WH to ground potential for the duration of the high-active ground potential control impulse.

On the other hand, the level converter 46 generates a reduced, e.g. negative, potential WN, which is, according to the invention, comparable to the low-active signal characteristic curve TL of the driver signal T which is generated by the driver 14 in the embodiment represented in FIG. 1.

Via the interconnection of the NOR gate 45 (inputs 45*a*, 45*b*, output 45*c*) subsequent to the drop of the ground potential control pulse due to the through-switching of the third n20 MOSFET 44, the potential on the transmission signal line 4 is dropped further to the potential WN, which is output by way of the output 46*d* of the level converter 46 and is comparable to the low-active level of the driver signal T. As a result, in the transition from a high-active transmission signal W to a low-inactive transmission signal W, an initial drop from high potential WH to ground potential occurs, even if only temporarily. An additional drop then occurs to a relatively low, e.g. negative, potential WN, which corresponds in particular to the low-active level TL of the driver signal T (i.e. WN≈TL).

FIGS. 3A to 3D represent the time characteristics or temporal courses of the various signals and potentials and thus the action of the circuit for the transmission signal driver 40.

FIGS. 3A to 3D represent the time characteristics of the control signal SW for the transmission signal driver 40; the ground potential control pulse MA (i.e. the potential at the node 49 with which the first n-MOSFET 42 is temporarily switched in order to drop the potential on the transmission signal line 4 to ground potential); the potential NW at the output 45*c* of the NOR gate 45 in the line 50; and with it the control potential at the gate 44G of the third n-MOSFET 44; and the transmission signal W on the transmission signal line 4.

Figure 3A:
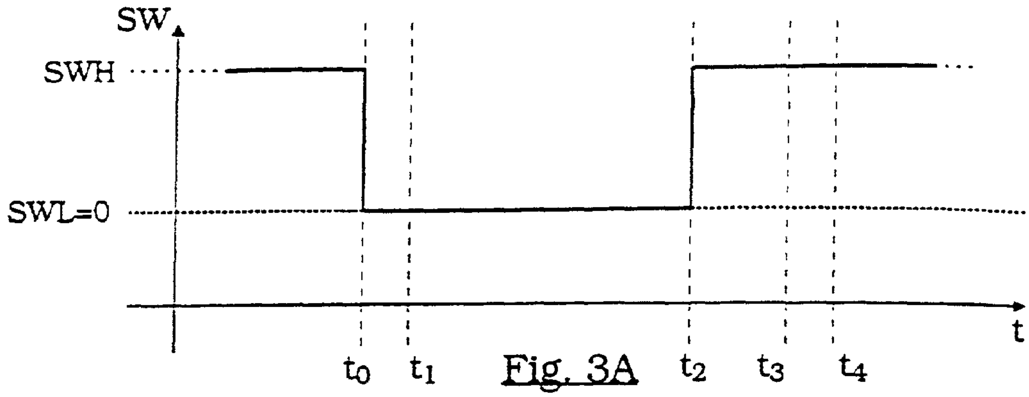
FIGS. 3A–3D are graphs illustrating the time sequence of the driver signal and the transmission signal.
Figure 3B:
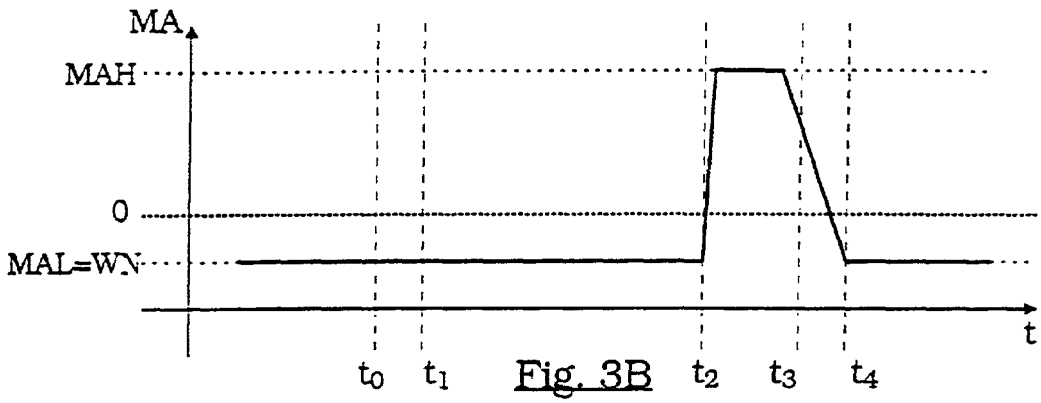
Figure 3C:
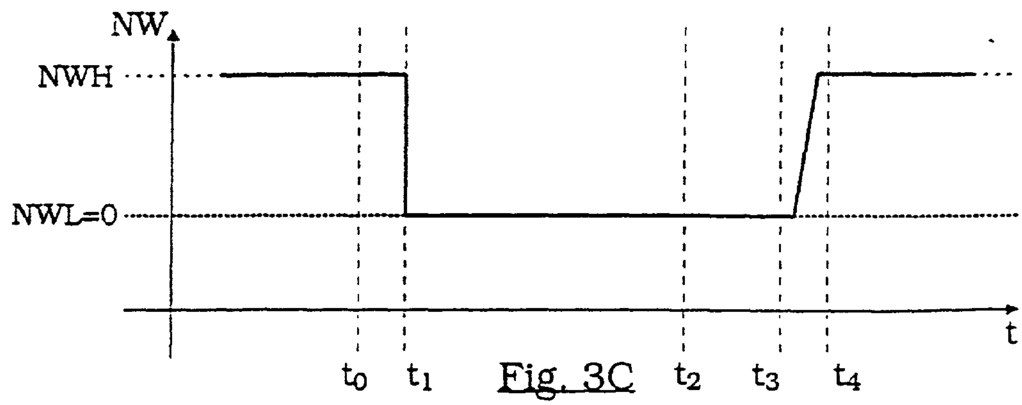

As represented in FIG. 3A, the control signal SW on the line 4 at the input region 4*a* of the transmission signal driver 40 is in the high-inactive state SWH. At time to an instantaneous transition from the high-inactive state to the low-active state SWL occurs; i.e., the potential in the input region 4 an is lowered by modifying the control signal SW from a relatively high positive value SWH to zero potential (SWL=0).

Figure 3D:
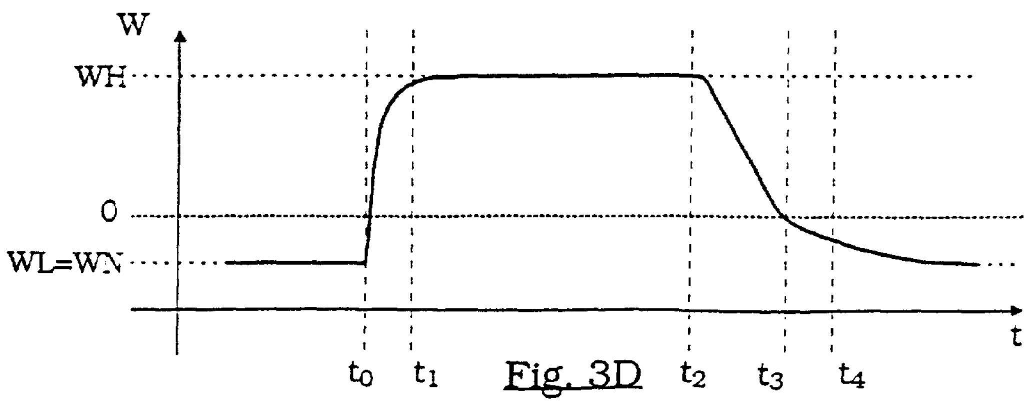

With a corresponding rise time which derives from the network, the transmission signal W represented in FIG. 3D rises starting at time to from the low-inactive level WL=WN, which is held in the negative range under ground potential, to its high-active level WH.

Following a short time delay, at time $t_1$ the control voltage NW at the gate 44G of the third n-MOSFET 44 drops to ground potential (NWH to NWL), which is equivalent to a low-inactive state at the gate 44G, i.e. NW=0. The third n-MOSFET 44 is thus in a non-conductive, open state, so that the potential WH on the transmission signal line 4, and thus the transmission signal W there, do not change.

At time $t_2$ the control signal SW in the input region 4*a* of the transmission signal driver 40 changes from the low-active state SWL to the high-inactive state SWH, as represented in FIG. 3A. At the same time, a ground potential control impulse MAH other than zero is generated by the level converter 46 and its internal wiring, as a result of which the potential in the node 49, and with it the control potential MA for the gate 42G of the first n-MOSFET 42, are converted from the low-inactive state MAL into the positive voltage range, and thus into a high-active level MAH. Consequently, in the region of time $t_2$, the first n-MOSFET switches through, so that there is a conductive connection to ground potential between the drain 42D and the transmission line 4, the second n-MOSFET 43 being likewise switched and conductive owing to the potential at the gate 43G of the second n-MOSFET 43, which acts as high-active potential.

Thus, as a result, starting at time $t_2$ the potential W on the transmission line 4, and thus the transmission signal W there, is gradually dropped in the transition to the target potential WL=WN, namely low-inactive, and in the time period between $t_3$ and $t_4$ it passes through the neutral ground potential and is then dropped to the negative and low-inactive potential WL=WN which is generated on the output line 46*d* of the level converter 46.

The through-switching to the potential WN which is present on the line 46*d* occurs with the cut-off or switching-off of the ground potential control impulse MA from MAH to MAL subsequent to time $t_4$, because after or near this time, the control potential at the gate 44G of the third n-MOSFET 44 becomes high-active, whereupon the connection between drain 44D and source 44S of the third n-MOSFET 44 is conductive, with the result that the transmission line 4, and thus the transmission signal W there, are drawn to the potential of the output line 46*d* of the level converter 46, as represented in FIG. 3D.

I claim:

1. A decoding device, comprising:

a final decoder for switchably transmitting a transmission signal, said final decoder including a switching unit having a field-controlled semiconductor switching device;

a transmission signal line connected to said final decoder;

a transmission signal driver operatively connected to said transmission signal line for generating the transmission signal with a given characteristic curve and for providing the transmission signal to said final decoder;

said transmission signal driver generating the transmission signal such that the characteristic curve is such that said field-controlled semiconductor switching device is one of substantially completely blockable and substantially completely blocked for a transmission of the transmission signal when the transmission signal is applied to said field-controlled semiconductor switching device and said field-controlled semiconductor switching device is inactivated;

a driver signal line connected to said field-controlled semiconductor switching device;

a driver device for generating a driver signal and outputting the driver signal on said driver signal line;

said driver device generating the driver signal such that the driver signal has a relatively lower electrical potential given an activation, and a relatively higher electrical potential given an inactivation;

said field-controlled semiconductor switching device having an input terminal and a control terminal;

said transmission signal driver being configured such that, given inactivation of said field-controlled semiconductor switching device, the transmission signal can be generated and fed to said input terminal of said field-controlled semiconductor switching device such that a target potential of the transmission signal is one of substantially equal to and lower than the relatively lower electrical potential of the driver signal; and said field-controlled semiconductor switching device being one of inactivatable and inactivated due to an electrical potential difference between said input terminal and said control terminal.

2. The decoding device according to claim 1, wherein said transmission signal driver generates the transmission signal such that the transmission signal has an electric potential with a temporal course as the given characteristic curve.

3. The decoding device according to claim 1, wherein:

said field-controlled semiconductor switching device has an input terminal; and said transmission signal driver provides the transmission signal to said input terminal of said field-controlled semiconductor switching device.

4. The decoding device according to claim 1, wherein said field-controlled semiconductor switching device is a field-effect transistor.

5. The decoding device according to claim 1, wherein said field-controlled semiconductor switching device is a p-MOSFET.

6. The decoding device according to claim 1, wherein said field-controlled semiconductor switching device is an n-MOSFET.

7. The decoding device according to claim 1, wherein said field-controlled semiconductor switching device is a field-effect transistor having a gate region as a control terminal, a source region as an input terminal, and a drain region.

8. The decoding device according to claim 1, wherein said field-controlled semiconductor switching device is a field-effect transistor having a gate region as a control terminal, a drain region as an output terminal, and a source region.

9. The decoding device according to claim 1, wherein:

said field-controlled semiconductor switching device is a field-effect transistor having a gate region as a control terminal, a source region as an input terminal, and a drain region as an output terminal;

said control terminal is connectable to a driver signal line; and at least one of said input terminal and said output terminal is connectable to a respective one of said transmission signal line and an output signal line.

10. The decoding device according to claim 9, wherein said transmission signal line is configured for supplying the transmission signal to said input terminal.

11. The decoding device according to claim 9, wherein said driver signal line is configured for supplying a driver signal to said control terminal.

12. The decoding device according to claim 9, wherein said output signal line is configured for outputting an output signal provided by said output terminal.

13. The decoding device according to claim 1, wherein said field-controlled semiconductor switching device is an enhancement-mode p-MOS field-effect transistor.

14. The decoding device according to claim 1, wherein said field-controlled semiconductor switching device is an enhancement-mode n-MOS field-effect transistor.

15. The decoding device according to claim 13, wherein said transmission signal driver is configured such that, given inactivation of said field-controlled semiconductor switching device, the transmission signal can be generated such that, prior to reaching a target potential, the transmission signal temporarily has a substantially neutral electric intermediate potential.

16. The decoding device according to claim 13, wherein said transmission signal driver is configured such that, given inactivation of said field-controlled semiconductor switching device, the transmission signal can be generated such that, prior to reaching a target potential, the transmission signal is temporarily substantially equal to a ground potential.

17. A decoding device, comprising:

a final decoder for switchably transmitting a transmission signal, said final decoder including a switching unit having a field-controlled semiconductor switching device;

a transmission signal line connected to said final decoder;

a transmission signal driver operatively connected to said transmission signal line for generating the transmission signal with a given characteristic curve and for providing the transmission signal to said final decoder;

said transmission signal driver generating the transmission signal such that the characteristic curve is such that said field-controlled semiconductor switching device is one of substantially completely blockable and substantially completely blocked for a transmission of the transmission signal when the transmission signal is applied to said field-controlled semiconductor switching device and said field-controlled semiconductor switching device is inactivated;

a driver signal line connected to said field-controlled semiconductor switching device;

a driver device for generating a driver signal and outputting the driver signal on said driver signal line;

said driver device generating the driver signal such that the driver signal has a relatively lower electrical potential given an inactivation, and a relatively higher electrical potential given an activation;

said field-controlled semiconductor switching device having an input terminal and a control terminal;

said transmission signal driver being configured such that, given inactivation of said field-controlled semiconductor switching device, the transmission signal can be generated and fed to said input terminal of said field-controlled semiconductor switching device such that a target potential of the transmission signal is one of substantially equal to and higher than the relatively higher electrical potential of the driver signal; and said field-controlled semiconductor switching device being one of inactivatable and inactivated due to an electrical potential difference between said input terminal and said control terminal.

18. The decoding device according to claim 17, wherein said transmission signal driver generates the transmission signal such that the transmission signal has an electric potential with a temporal course as the given characteristic curve.

19. The decoding device according to claim 17, wherein:

said field-controlled semiconductor switching device has an input terminal; and said transmission signal driver provides the transmission signal to said input terminal of said field-controlled semiconductor switching device.

20. The decoding device according to claim 17, wherein said field-controlled semiconductor switching device is a field-effect transistor.

21. The decoding device according to claim 17, wherein said field-controlled semiconductor switching device is a p-MOSFET.

22. The decoding device according to claim 17, wherein said field-controlled semiconductor switching device is an n-MOSFET.

23. The decoding device according to claim 17, wherein said field-controlled semiconductor switching device is a field-effect transistor having a gate region as a control terminal, a source region as an input terminal, and a drain region.

24. The decoding device according to claim 17, wherein said field-controlled semiconductor switching device is a field-effect transistor having a gate region as a control terminal, a drain region as an output terminal, and a source region.

25. The decoding device according to claim 17, wherein:

said field-controlled semiconductor switching device is a field-effect transistor having a gate region as a control terminal, a source region as an input terminal, and a drain region as an output terminal;

said control terminal is connectable to a driver signal line; and at least one of said input terminal and said output terminal is connectable to a respective one of said transmission signal line and an output signal line.

26. The decoding device according to claim 25, wherein said transmission signal line is configured for supplying the transmission signal to said input terminal.

27. The decoding device according to claim 25, wherein said driver signal line is configured for supplying a driver signal to said control terminal.

28. The decoding device according to claim 25, wherein said output signal line is configured for outputting an output signal provided by said output terminal.

29. The decoding device according to claim 17, wherein said field-controlled semiconductor switching device is an enhancement-mode p-MOS field-effect transistor.

30. The decoding device according to claim 17, wherein said field-controlled semiconductor switching device is an enhancement-mode n-MOS field-effect transistor.

31. The decoding device according to claim 29, wherein said transmission signal driver is configured such that, given inactivation of said field-controlled semiconductor switching device, the transmission signal can be generated such that, prior to reaching a target potential, the transmission signal temporarily has a substantially neutral electric intermediate potential.

32. The decoding device according to claim 29, wherein said transmission signal driver is configured such that, given inactivation of said field-controlled semiconductor switching device, the transmission signal can be generated such that, prior to reaching a target potential, the transmission signal is temporarily substantially equal to a ground potential.

* * * * *